(12) United States Patent
Kawamura et al.

(10) Patent No.: US 10,796,743 B2
(45) Date of Patent: *Oct. 6, 2020

(54) DYNAMIC ADJUSTMENT OF MEMORY CELL DIGIT LINE CAPACITANCE

(71) Applicant: Micron Technology, Inc., Boise, ID (US)

(72) Inventors: Christopher Kawamura, Boise, ID (US); Charles Ingalls, Meridian, ID (US); Scott Derner, Boise, ID (US)

(73) Assignee: Micron Technology, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 16/184,492

(22) Filed: Nov. 8, 2018

(65) Prior Publication Data

US 2019/0147932 A1    May 16, 2019

Related U.S. Application Data

(63) Continuation of application No. 15/858,824, filed on Dec. 29, 2017, now Pat. No. 10,153,024, which is a continuation of application No. 15/688,680, filed on Aug. 28, 2017, now Pat. No. 9,934,839, which is a continuation of application No. 15/095,962, filed on Apr. 11, 2016, now Pat. No. 9,786,348.

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01); *G11C 11/2259* (2013.01); *G11C 11/2275* (2013.01)

(58) Field of Classification Search
CPC .......... G11C 11/2273; G11C 11/221; G11C 11/2255; G11C 11/2259; G11C 11/2275
USPC ......................................... 365/145
See application file for complete search history.

(56) References Cited

U.S. PATENT DOCUMENTS

| | | | |
|---|---|---|---|
| 5,218,566 A | 6/1993 | Papaliolios | |
| 5,245,569 A * | 9/1993 | Gonzalez | G11C 16/12 365/104 |
| 6,411,549 B1 * | 6/2002 | Pathak | G11C 7/067 365/185.2 |
| 8,023,308 B1 | 9/2011 | Evans, Jr. et al. | |
| 9,786,348 B1 | 10/2017 | Kawamura et al. | |
| 9,934,839 B2 * | 4/2018 | Kawamura | G11C 11/221 |
| 10,153,024 B2 * | 12/2018 | Kawamura | G11C 11/221 |

* cited by examiner

*Primary Examiner* — Huan Hoang
(74) *Attorney, Agent, or Firm* — Holland & Hart LLP

(57) ABSTRACT

Methods, systems, and devices for operating a ferroelectric memory cell or cells are described. A ferroelectric memory cell may be used to store a logic state. The capacitance of a digit line of the ferroelectric memory cell may be dynamically increased prior to, and during a portion of, a read operation used to determine a stored logic state of the cell. The capacitance may be increased by leveraging intrinsic capacitance of digit lines of the array—e.g., by shorting one digit line to another digit line. Increasing the capacitance of the digit line may increase the signal on the digit line that is sensed during the read operation.

20 Claims, 10 Drawing Sheets

DYNAMIC ADJUSTMENT OF MEMORY CELL DIGIT LINE CAPACITANCE

CROSS REFERENCE

The present Application for Patent is a continuation of U.S. patent application Ser. No. 15/858,824 by Kawamura et al., entitled "Dynamic Adjustment of Memory Cell Digit Line Capacitance," filed Dec. 29, 2017, which is a continuation of U.S. patent application Ser. No. 15/688,680 by Kawamura et al., entitled "Dynamic Adjustment of Memory Cell Digit Line Capacitance," filed Aug. 28, 2017, which is a continuation of U.S. patent application Ser. No. 15/095,962 by Kawamura et al., entitled "Dynamic Adjustment of Memory Cell Digit Line Capacitance," filed Apr. 11, 2016, assigned to the assignee hereof, and each of which is expressly incorporated by reference in its entirety herein.

BACKGROUND

The following relates generally to memory devices and more specifically to dynamic adjustment of memory cell digit line capacitance.

Memory devices are widely used to store information in various electronic devices such as computers, wireless communication devices, cameras, digital displays, and the like.

Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may become discharged over time through leakage currents, resulting in the loss of the stored information. Certain aspects of volatile memory may offer performance advantages, such as faster read or write speeds, while aspects of non-volatile, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes may, however, extract only a fraction of the ferroelectric capacitor's stored charge when determining the stored logic state. This may reduce the reliability of sensing operations or may limit memory cell (or array) size reductions that could otherwise be made.

BRIEF DESCRIPTION OF THE DRAWINGS

The disclosure herein refers to and includes the following figures.

DETAILED DESCRIPTION

The charge extracted from a memory cell may be increased by adjusting capacitance of a digit line of the memory cell during a portion of the read operation. For example, the digit line of a memory cell may be connected to an inactive digit line during the initial transfer of charge from the capacitor of the memory cell to the digit line. This connection may increase the capacitance of the digit line, allowing more voltage to be applied across the memory cell and more charge to be extracted from the cell.

Memory cells, including FeRAM cells, within a memory array may be accessed by a word line (or access line) and a digit line (or bit line). A single digit line may connect many memory cells and may be connected to a sense amplifier that, when activated, may determine the stored logic state of a memory cell. To facilitate increased charge extraction, and thus improve signal strength used for sense operation, the capacitance of the digit line may be increased during the beginning portion of the sense operation. The capacitance may be increased by shorting the digit line to another component that has its own capacitance. For example, the digit line may be dynamically connected to another digit line with an intrinsic capacitance, it may be shorted to a capacitor, or the like. Increasing the digit line capacitance may increase the voltage across the capacitor of the cell during a read operation, resulting in greater charge extraction from the memory cell. This charge may be accumulated on the digit line to develop a voltage used for a sense or read operation. Prior to the sense operation, the capacitance of the digit line may be reduced (e.g., by isolating the digit line from the component with the extra capacitance).

Aspects of the disclosure introduced above are further described below in the context of a memory array. Specific examples are then described for dynamically increasing digit line capacitance of a ferroelectric memory cell. These and other aspects of the disclosure are further illustrated by and described with reference to apparatus diagrams, system diagrams, and flowcharts that relate to adjustment of digit line capacitance adjustment for sensing operation.

Figure 1:
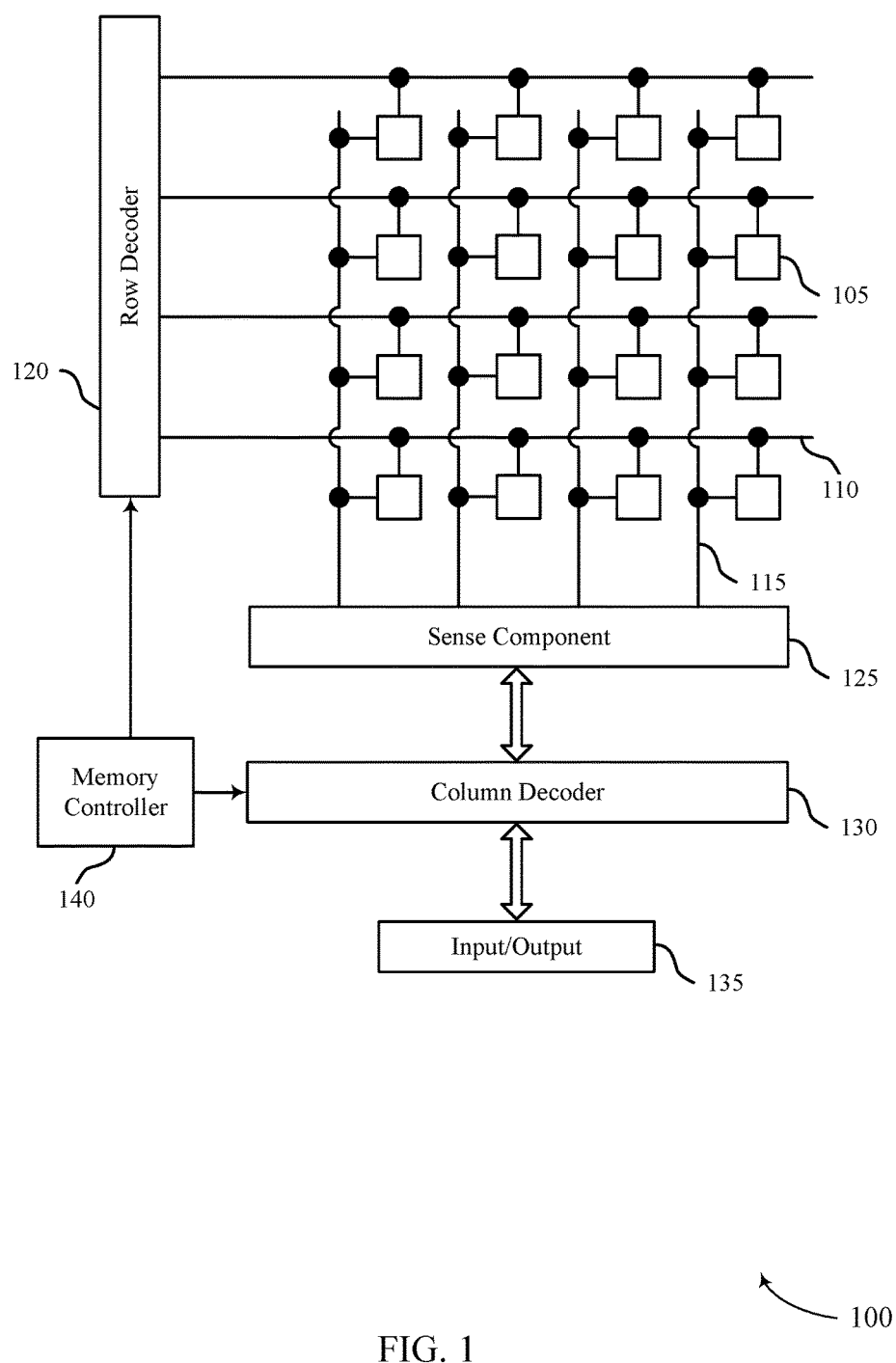
FIG. 1 illustrates an example memory array that supports dynamically adjusting digit line capacitance of a ferroelectric memory cell in accordance with various embodiments of the present disclosure.

FIG. 1 illustrates an example memory array 100 that supports connection of digit lines during sensing in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, a memory cell 105 is configured to store more than two logic states. A memory cell 105 may include a capacitor to store a charge representative of the programmable states; for example, a charged and uncharged capacitor may represent two logic states. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties, and some details and advantages of a ferroelectric memory cell 105 are discussed below.

Operations such as reading and writing may be performed on memory cells 105 by activating or selecting the appropriate word line 110 and digit line 115. A word line 110 may also be referred to as an access line 110. Activating or selecting a word line 110 or a digit line 115 may include applying a voltage potential (e.g., a positive voltage or a negative voltage) to the respective line. In some cases, a digit line 115 may be referred to as a bit line. Word lines 110 and digit lines 115 may be made of conductive materials. In some examples, word lines 110 and digit lines 115 are made of metals (e.g., copper, aluminum, gold, tungsten, etc.). According to the example of FIG. 1, each row of memory cells 105 are connected to a single word line 110, and each column of memory cells 105 are connected to a single digit line 115. By activating one word line 110 and one digit line 115, a single memory cell 105 may be accessed at their intersection. The intersection of a word line 110 and digit line 115 may be referred to as an address of a memory cell.

In some architectures, the logic storing device of a cell, e.g., a capacitor, may be electrically isolated from the digit line by a selection device. The word line 110 may be connected to and may control the selection device. For example, the selection device may be a transistor and the word line 110 may be connected to the gate of the transistor. Activating the word line 110 results in an electrical connection between the capacitor of a memory cell 105 and its corresponding digit line 115. The digit line may then be accessed to either read or write the memory cell 105. In some cases, the capacitance of the digit line may be dynamically increased during the beginning portion of a read operation to increase the signal sensed by sense component 125.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed. As described herein, after a word line 115 has been activated, and prior to activation of sense component 125, the capacitance of a digit line 115 may be increased for a duration of time.

Upon accessing, a memory cell 105 may be read, or sensed, by sense component 125. For example, sense component 125 may compare a signal (e.g., a voltage) of the relevant digit line 115 to a reference signal (not shown) in order to determine the stored state of the memory cell 105. If digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, the accuracy of a sensing operation may be increased increasing the signal output by a memory cell 105. As described herein, the signal output by a memory cell 105 may be increased by increasing the capacitance of the corresponding digit line 115.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. In the case of a ferroelectric capacitor, a memory cell 105 is written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high—e.g., tens of refresh operations per second may be employed for DRAM—which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

Ferroelectric memory cells may, however, have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, as described herein, ferroelectric memory cells may dynamically adjust digit line capacitance to improve read accuracy.

The memory controller 140 may control the operation (e.g., read, write, re-write, refresh, etc.) of memory cells 105 through the various components, for example, row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
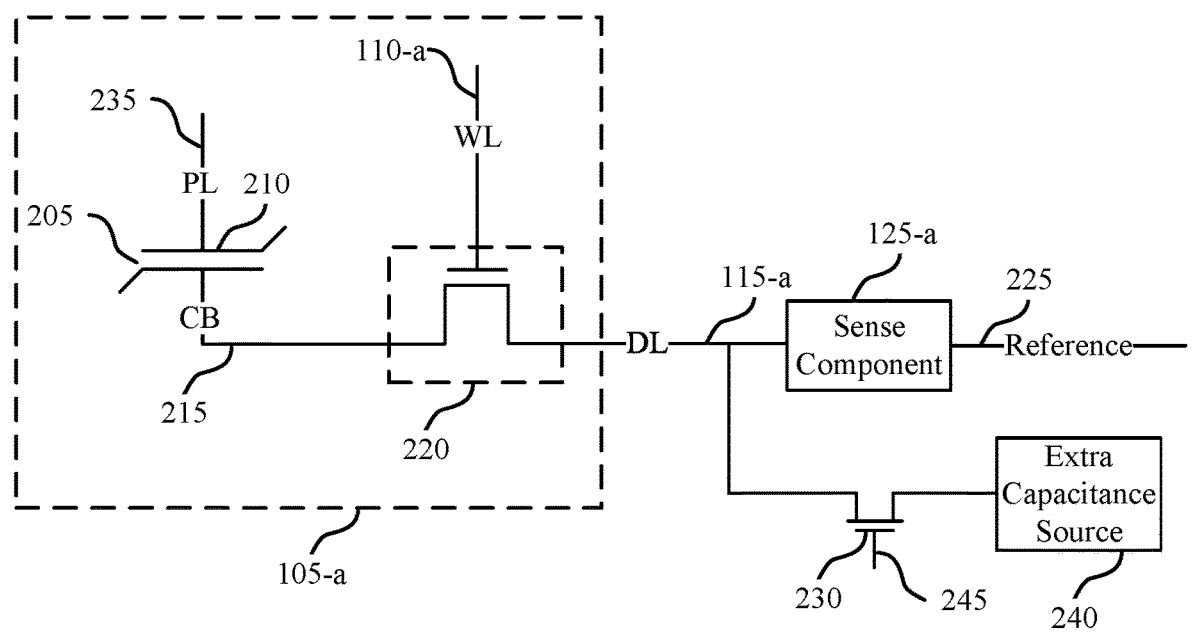
FIG. 2 illustrates an example circuit of a memory cell that supports dynamically adjusting digit line capacitance in accordance with various embodiments of the present disclosure.

FIG. 2 illustrates an example circuit 200 that supports dynamically increasing digit line capacitance of a ferroelectric memory cell in accordance with various embodiments of the present disclosure. Circuit 200 includes a ferroelectric memory cell 105-a, word line (WL) (or access line) 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205, which has a first plate and a second plate that are capacitively coupled. The first plate may be referred to as cell plate 210 and the second plate may be referred to as cell bottom 215. Cell plate 210 may be accessed via plate line (PL) 235 and cell bottom 215 may be accessed via digit line (DL) 115-a. In the example of FIG. 2, the terminals of capacitor 205 are separated by an insulating ferroelectric material. As described above, various states may be stored by charging or discharging capacitor 205, i.e., polarizing the ferroelectric material of capacitor 205. The total charge need to polarize capacitor 205 may be referred to as the remnant polarization (PR) value, and a voltage of capacitor 205 at which half the total charge of capacitor 205 is reached may be referred to as the coercive voltage (VC).

The stored state of capacitor 205 may be read or sensed by operating various elements represented in circuit 200. Capacitor 205 may be in electronic communication with digit line 115-a. Capacitor 205 may thus be isolated from the digit line 115-a when selection component 220 is deactivated, and capacitor 205 may be connected to digit line 115-a via selection component 220 when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. In some cases, selection component 220 may be a transistor and its operation may be controlled by applying a voltage to the transistor gate, where the voltage magnitude is such that the threshold magnitude of the transistor is overcome.

Word line 110-a may activate selection component 220; for example, a voltage applied to word line 110-a may be applied to the transistor gate, connecting capacitor 205 with digit line 115-a. In an alternative embodiment, the positions of selection component 220 and capacitor 205 may be switched so that selection component 220 is between plate line 235 and cell plate 210 and so that capacitor 205 is between digit line 115-a and the other terminal of selection component 220. In such cases, selection component 220 may remain in electronic communication digit line 115-a through capacitor 205. This configuration may be associated with alternative timing.

In the example depicted in FIG. 2, capacitor 205 is a ferroelectric capacitor. Due to the ferroelectric material between the plates of capacitor 205, and as discussed in more detail below, capacitor 205 may not discharge upon connection to digit line 115-a. In one scheme, to sense the state that is stored by ferroelectric capacitor 205 during a read, plate 210 and word line 110-a may be biased by an external voltage. Selecting ferroelectric memory cell 105-a may result in a voltage difference (e.g., plate 210 voltage minus digit line 115-a voltage) across capacitor 205. The applied voltage difference may yield a change in the stored charge on capacitor 205, which may depend on the initial state of capacitor 205—e.g., whether the initial state stored a logic "1" or a logic "0"—and may induce a voltage on digit line 115-a based on the resulting charge stored on capacitor 205. The induced voltage on digit line 115-a may then be compared to a reference (e.g., a voltage of reference line 225) by sense component 125-a in order to determine the stored logic state in memory cell 105-a.

The specific sensing scheme or process may take many forms. In some examples, digit line 115-a may have an intrinsic capacitance and develop a non-zero voltage as capacitor 205 charges or discharges in response to the voltage applied to plate 210. The intrinsic capacitance may depend on physical characteristics of, including the dimensions of, digit line 115-a. Digit line 115-a may connect many memory cells 105 so digit line 115-a may have a length that results in a non-negligible capacitance (e.g., on the order of pF or fF). The subsequent voltage of digit line 115-a may depend on the initial logic state of capacitor 205, and sense component 125-a may compare this voltage to a reference voltage provided by a reference component. For example, a voltage may be applied to plate 210 and a voltage at capacitor bottom 215 may change in relation to the stored charge. The voltage at capacitor bottom 215 may be compared with a reference voltage at sense component 125-a, and a comparison to the reference voltage may indicate a change in the charge of capacitor 205 resulting from the applied voltage and thus indicate a logic state stored in memory cell 105-a. The relationship between charge and voltage in capacitor 205 is described in further detail with reference to FIG. 3.

In some cases, the capacitance of digit line 115-a may be dynamically increased prior to activation of sense component 125-a. As described herein, digit line 115-a may be in electronic communication with a switching component 230 and extra capacitance source 240. The extra capacitance source 240 may be a component or set of components with a total capacitance value. For instance, the extra capacitance source 240 may be a digit line 115 of another memory cell (e.g., an inactive memory cell) or a capacitor. Activation of the switching component 230 may increase the capacitance of digit line 115-a by adding some or all of the capacitance of extra capacitance source 240 to the intrinsic capacitance of digit line 115-a. The boost in capacitance experienced by digit line 115-a may increase the voltage across the capacitor 205, resulting in a fuller charge extraction. In some examples, the activation of the switching component 230 may occur prior to the activation of selection component 220, and may extend for a period of time after the activation of selection component 220. That is, selection component 220 may be activated (e.g., by applying a voltage to word line 110-a) after, or based on, the activation of switching component 230 (e.g., shorting digit line 115-a to extra capacitance source 240). The switching component 230 may be disabled, or deactivated, prior to activation of sense component 125-a. Thus, the capacitance of digit line 115-a may be reduced after activation of selection component 220 (e.g., based on application of voltage to word line 110-a) and before activation of sense component 125-a. Switching component 230 may be activated or deactivated by applying the appropriate voltage (e.g., a positive or negative voltage) to gate 245.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of plate 210 using plate line 235 and controlling the voltage of cell bottom 215 using digit line 115-a. To write a logic 1, plate 210 may be taken high, that is, a positive voltage may be applied, and cell bottom 215 may be taken low, i.e., connected to ground, virtually grounded, or a negative voltage may be applied to plate 210. The opposite process is performed to write a logic 0, i.e., the voltage of plate 210 may be taken low and the voltage of cell bottom 215 may be taken high. Read and write operations of capacitor 205 may account for the non-linear properties associated with a ferroelectric device.

Figure 3:
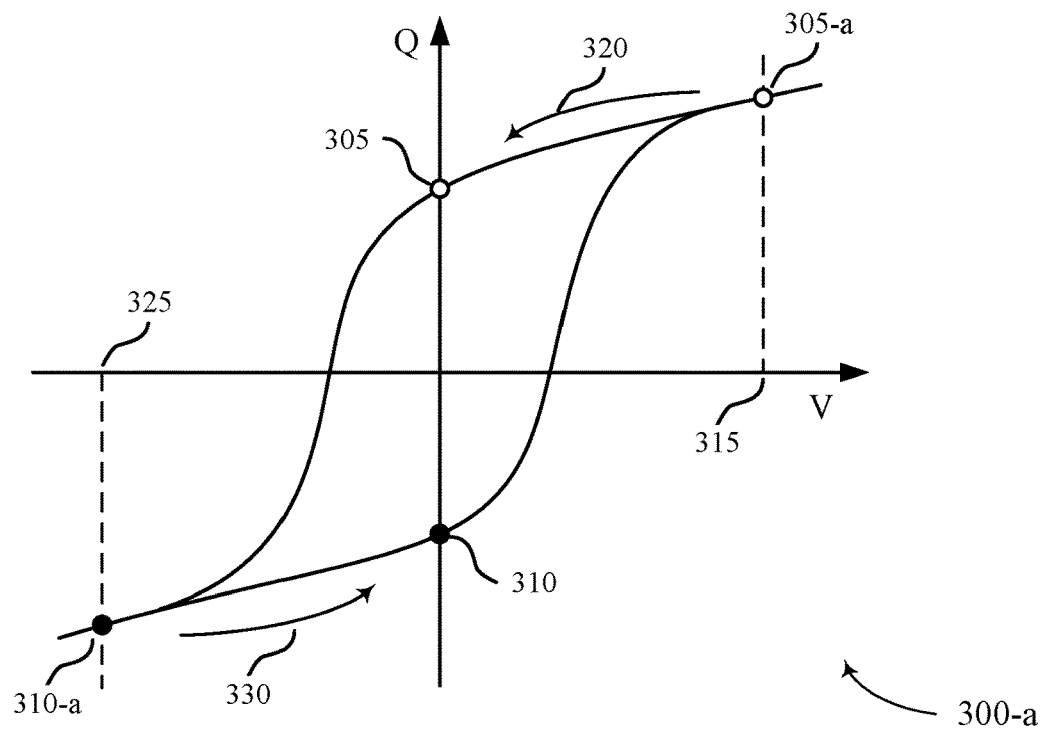
FIG. 3 illustrates example hysteresis plots for operating a ferroelectric memory cell that supports dynamically adjusting digit line capacitance in accordance with various embodiments of the present disclosure.
Figure 3:
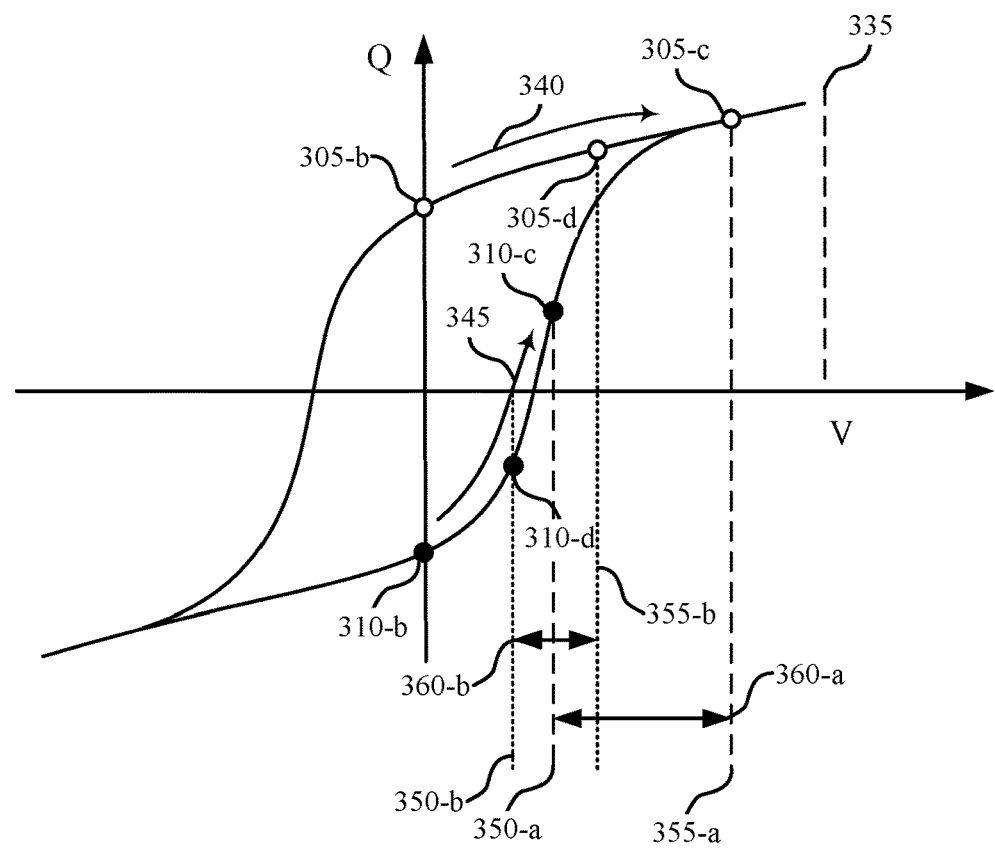

Read and write operations of capacitor 205 may account for the non-linear properties associated with a ferroelectric device. FIG. 3 illustrates examples of such non-linear properties with hysteresis curves 300 for a ferroelectric memory cell that supports dynamically increasing digit line capacitance of a ferroelectric memory cell in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitors 205 of FIG. 2) as a function of a voltage, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge will accumulate at the terminal. Likewise, if the ferroelectric material has a positive polarization, negative charge will accumulate at the terminal. Additionally, it should be understood that the voltages in hysteresis curves 300 represent a voltage difference across the capacitor and are directional. For example, a positive voltage may be applied by applying a positive voltage to the terminal in question and maintaining the second terminal at ground. A negative voltage may be applied by maintaining the terminal in question at ground and applying a positive voltage to the second terminal, i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage.

To read, or sense, the stored state of the ferroelectric capacitor, a voltage may be applied across the capacitor. In response, the stored charge changes, and the degree of the change depends on the initial charge state—i.e., the degree to which the stored charge of the capacitor changes varies depending on whether charge state 305-b or 310-b was initially stored. For example, hysteresis curve 300-b illustrates two possible stored charge states 305-b and 310-b. Net voltage 335 may be applied to the plate (e.g., plate 210 with reference to FIG. 2) of the capacitor. Although depicted as a positive voltage, voltage 335 may be negative. In response to voltage 335, charge state 305-b may follow path 340 (e.g., to the final position of charge state 305-d). Likewise, if charge state 310-b was initially stored, then it follows path 345 (e.g., to the final position of charge state 310-d).

The final position of charge state 305-d and charge state 310-d may depend on a number of factors, including the specific sensing operation and circuitry and the voltage across the capacitor. A greater voltage across the capacitor may result in a greater final charge state 310 or 305. For example, in terms of a logic 1, the voltage 350-a across the capacitor may result in final charge state 310-c, which has a greater charge than final charge state 310-d, which results when the voltage 350-b is across the capacitor. In terms of a logic 0, the voltage 355-a across the capacitor may result in final charge state 305-c, which has a greater charge than final charge state 305-d, which results when the voltage 355-b is across the capacitor. The voltage across a capacitor may be increased by increasing the voltage applied to the plate and/or decreasing the voltage of the digit line.

As discussed herein, voltage of the digit line may be reduced by increasing the capacitance of the digit line of a memory cell. If the cell bottom of the capacitor is electrically connected to the digit line when voltage 335 is applied, the voltage of the digit line may rise due to its intrinsic capacitance and reduce the net voltage applied across the cell. Due to the inverse relationship between voltage and capacitance, an increase in digit line capacitance may reduce the voltage of the digit line. Thus, increasing the capacitance of a digit line may increase the voltage across the cell (e.g., by decreasing the voltage of the digit line while maintaining the voltage applied to the plate).

In the example depicted in FIG. 3, final charge state 305-c and final charge state 310-c may correspond to an increased digit line capacitance (and increased voltage across the cell) compared with final charge state 305-d and final charge state 310-d. The position of final charge states 305-c and 310-c (or 305-d and 310-d) on hysteresis curve 300-b may thus depend on the capacitance of the digit line and may be determined through a load-line analysis, i.e., charge states 305-c and 310-c (or 305-d and 310-d) may be defined with respect to the digit line capacitance.

When a digit line is used for a read operation, the resulting voltage of the digit line may be the difference between voltage 335 and voltage 350 (for a logic 0), or the difference between voltage 335 and voltage 355 (for a logic 1) (e.g., depending on the stored logic state). By comparing the digit line voltage to a reference voltage, the initial state of the capacitor may be determined. For example, the reference voltage may be an average of the digit line logic 0 and logic 1 voltages, e.g., [(voltage 335–voltage 350)+(voltage 335–355)]/2. Upon comparison, the sensed digit line voltage may be determined to be higher or lower than the reference voltage. A value of the ferroelectric cell (i.e., a logic 0 or 1) may then be determined based on the comparison.

In some cases, there may not be much difference between voltage 350-a and voltage 355-a or voltage 350-b and voltage 355-b. In such scenarios, comparisons between the sensed voltage and the reference voltage may susceptible to error. As described herein, the difference between the voltages 350 and 355 may be a function of the digit line capacitance. For example, the difference 360-a between voltage 350-a and voltage 355-a, which corresponds to a high digit line capacitance, may be greater than the difference 360-b between voltage 350-b and voltage 355-b, which corresponds to a low digit line capacitance. Thus, increasing the digit line capacitance of a cell may increase the difference 360 between the voltages associated with charge states for a logic 1 and a logic 0, which may in turn reduce read errors. The difference 360 may be referred to as a sense window or margin window.

In some cases, the capacitance of the digit line may be increased by connecting (e.g., shorting) the digit line to another digit line (e.g., a reference cell digit line) with intrinsic capacitance during a portion of the read operation. To avoid or mitigate excessive charge-sharing with the other digit line, the increased capacitance of the digit line may be reduced to its original value (e.g., by isolating the two digit lines) after a threshold period of time. In some examples, the capacitance of a digit line may be increased by connecting (e.g., shorting) the digit line to a component with its own capacitance (e.g., a capacitor).

As discussed above, reading a memory cell that does not use a ferroelectric capacitor may degrade or destroy the stored logic state. A ferroelectric memory cell, however, may maintain the initial logic state after a read operation. For example, if charge state 305-b is stored and the read operation performed, the charge state may follow path 340 to charge state 305-c, and after removing voltage 335, the charge state may return to initial charge state 305-b, for example, by following path 340 in the opposite direction.

Figure 4A:
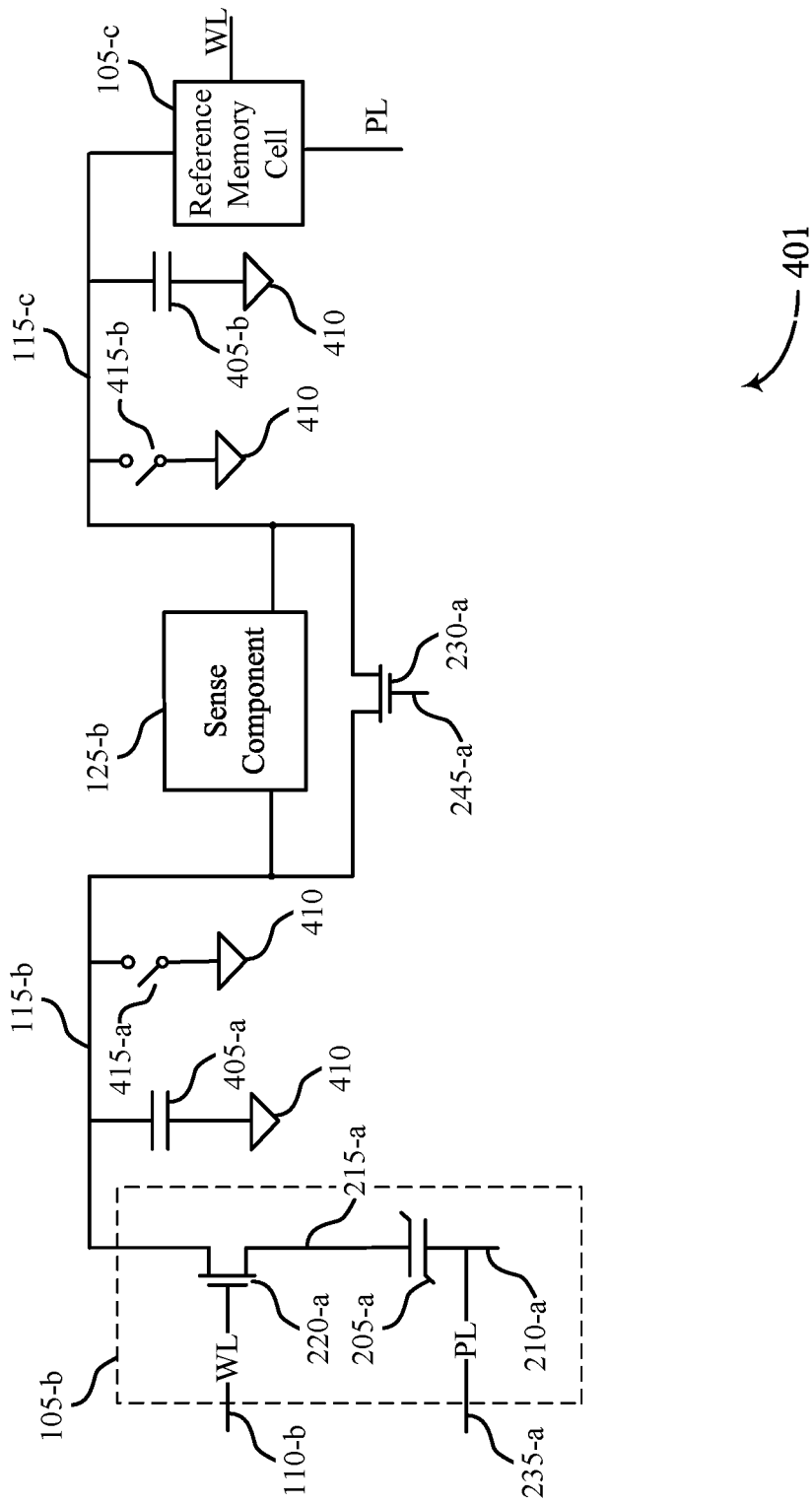
FIGS. 4A and 4B illustrate example circuits that support dynamically adjusting digit line capacitance of a ferroelectric memory cell in accordance with various embodiments of the present disclosure.

FIG. 4A illustrates an example circuit 401 that supports dynamically increasing digit line capacitance of a ferroelectric memory cell in accordance with various embodiments of the present disclosure. Circuit 401 may be operated so that the capacitance of the memory cell digit line is dynamically adjusted prior to and during a sense operation. Circuit 401 may include an active memory cell 105-b and a reference memory cell 105-c, which may be examples of a memory cell 105 described with reference to FIGS. 1 and 2. Reference memory cell 105-c may be an inactive memory cell in that its corresponding word line is not activated (e.g. the selection component is off). For example, reference memory cell 105-c may be connected to a different word line than active memory cell 105-b (e.g., reference memory cell 105-c may be part of a different row or different memory array than active memory cell 105-b, or reference memory cell 105-c may be located at the border of the memory array, etc.). Or there may be a switching component (not shown) (e.g., between the word line and memory cell 105-c) that prevents reference memory cell 105-c from being activated when the word line is activated. In another example, a selection component included in reference memory cell 105-c may be the opposite type compared with selection component 220-a so that the selection component of reference memory cell 105-c is deactivated when selection component 220-a is activated and vice versa.

Active memory cell 105-b may include selection component 220-a and capacitor 205-a (e.g., a ferroelectric capacitor). Capacitor 205-a may include plate 210-a, which is accessed using plate line 235-a, and cell bottom 215-a, which is accessed using word line 110-b. Reference memory cell 105-c may include a ferroelectric capacitor and selection component (not shown). Memory cell 105-b may be selected using selection component 220-a by applying a voltage to word line 110-b (which may also be referred to as access line 110-b). The voltage applied to word line 110-b may be a positive voltage, as described herein, or a negative voltage.

According to the example depicted in FIG. 4A, digit line 115-b includes intrinsic digit line capacitance that may be modeled as a capacitor 405-a between digit line 115-b and ground 410. Digit line 115-b is capable of being connected to ground 410 (or another voltage reference in some examples) via activation of switching component 415-a. Similarly, digit line 115-c includes intrinsic digit line capacitance that is modeled as capacitor 405-b. Digit line 115-c is capable of being connected to ground 410 (or another voltage reference in some examples) via activation of switching component 415-b. The intrinsic digit line capacitance may depend on the physical characteristics, including the dimensions, of the respective digit line. The switching components 415 may be implemented using switching components known in the art (e.g., transistors). For example, switching component 415 may be a transistor connected in series with switching component 230-a and digit line 115-b. In some cases, the transistor comprises an n-type FET. Although shown external to sense component 125-b, in some examples the switching components 415 may be internal to sense component 125-b.

Circuit 401 also includes switching component 230-a, which may be an example of switching component 230 described with reference to FIG. 2. Switching component 230-a may be in electronic communication with digit line 115-b and digit line 115-c. In some cases, switching component 230-a may be included in sense component 125-b. Switching component 230-a may be activated by applying a voltage to the gate 245-a of switching component 230-a. The voltage used to activate switching component 230-a may be a positive voltage or a negative voltage. When activated, switching component 230-*a* may connect (e.g., short) digit line 115-*b* to digit line 115-*c*, and the capacitance of digit line 115-*b* may be increased. In such cases, the capacitance of digit line 115-*b* is effectively the capacitance of capacitor 405-*a* plus the capacitance of capacitor 405-*b*. When the capacitance of digit line 115-*b* is increased, the voltage across capacitor 205-*a* may increase as well (e.g., due digit line 115-*a* being held close to 0V).

As described herein, the voltage across capacitor 205-*a* may be the voltage applied at plate 210-*a* minus the voltage of digit line 115-*b*. The voltage capacity of capacitor 405 may be inversely related to the capacitance of digit line 115-*b*. Thus, activation of switching component 230-*a* may reduce the amount of voltage capable of being held across capacitor 405-*a*, which in turn may increase the voltage applied across capacitor 205-*a*. According to hysteresis curve 300, larger voltages across a capacitor promote greater charge transfer. Greater charge transfer to digit line 115-*a* may result in a larger signal (e.g., voltage) for comparison by sense component 125-*b*, which may improve sensing accuracy.

Selection component 220-*a* may be activated by applying a voltage to word line 110-*b*. When selection component 220-*a* is activated, the voltage at cell bottom 215-*a* may be the voltage on the digit line 115-*b*. This voltage may be the voltage applied at plate 210-*a* minus the voltage across capacitor 205-*a*. As described above, the voltage across a capacitor 205 may correspond to a logic 1 or a logic 0. Thus, the voltage on digit line 115-*a* when voltage is applied to the plate 210-*a* and word line 110-*b* may represent a logic 0 or a logic 1. When switching component 230-*a* is activated (e.g., by applying a voltage to gate 245-*a*), digit line 115-*b* may be connected (e.g., shorted) to digit line 115-*c* so the capacitance of digit line 115-*b* is increased. When switching component 230-*a* is deactivated, digit line 115-*b* may be isolated from digit line 115-*c* so the capacitance of digit line 115-*b* is reduced (e.g., to its original value). Thus, the capacitance of digit line 115-*b* may be dynamically adjusted (e.g., increased or decreased). In some examples, the capacitance of digit line 115-*b* may be increased prior to activation of selection component 220-*a* and decreased prior to activation of sense component 125-*a*.

In some cases, digit line 115-*b* and digit line 115-*c* may be initialized to the same voltage prior to the activation of switching component 230-*a*. For example, digit line 115-*b* may be initialized to 0V (e.g., ground 410) using switching component 415-*a* and digit line 115-*c* may be initialized to 0V (e.g., ground 410) using switching component 415-*b*. Although described with regards to ground 410, the digit lines 115 may be initialized to a different voltage (e.g., by using a voltage reference different than ground 410). In some cases, the operations described with reference to FIG. 4A may be facilitated by a controller (e.g., a memory controller 140) that is in electronic communication with memory cell 105-*c*, memory cell 105-*c*, sense component 125-*b*, and switching component 415-*a*.

Figure 4B:
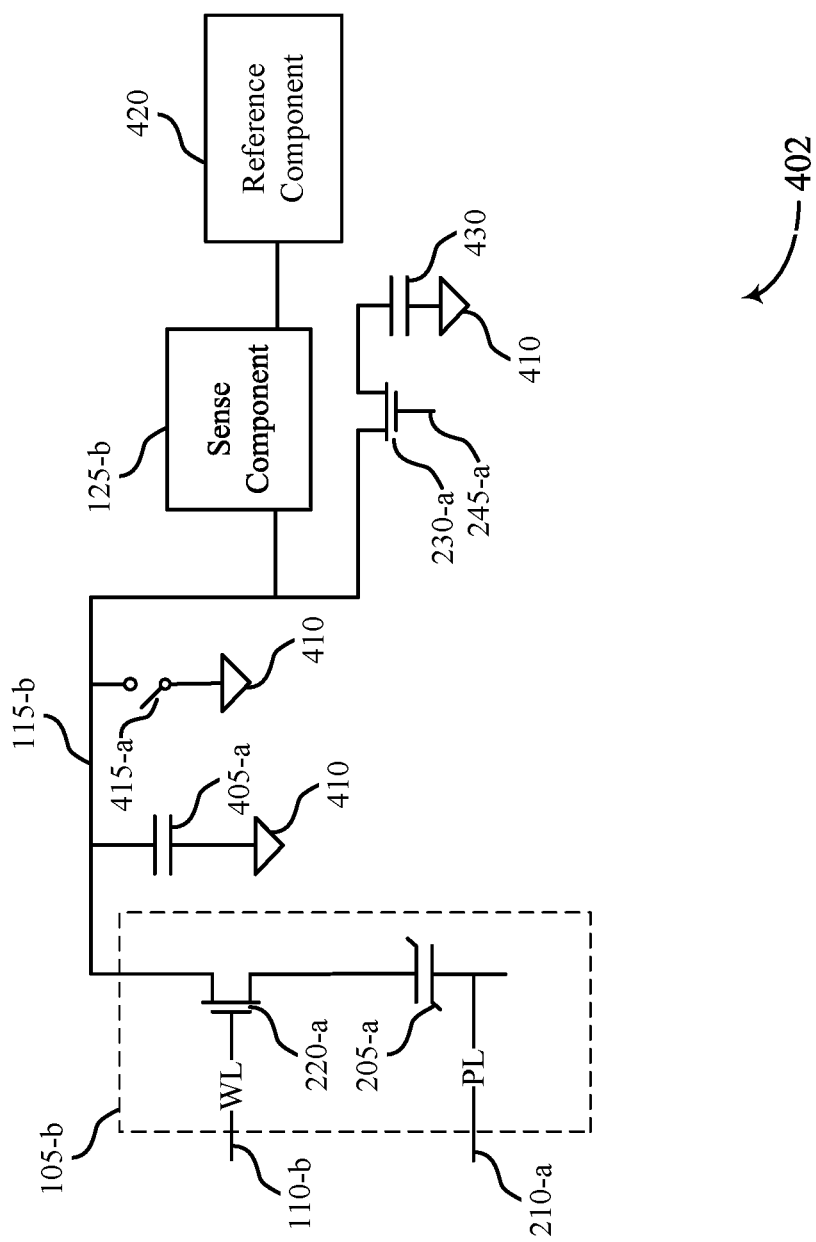

FIG. 4B illustrates an example circuit 402 that supports dynamically increasing digit line capacitance of a ferroelectric memory cell in accordance with various embodiments of the present disclosure. Circuit 402 may be an example of circuit 401 and may include capacitor 430 and reference component 420. Reference component 420 may provide a reference voltage to sense component 125-*b*. The reference voltage may be compared to a voltage on digit line 115-*b* to determine a logic state of memory cell 105-*b*. Capacitor 430 may be a single capacitor, or multiple capacitors, with a capacitance value.

When switching component 230-*a* is activated (e.g., by applying a voltage to gate 245-*a*), digit line 115-*b* may be connected to capacitor 430 so that the capacitance of digit line 115-*b* is dynamically increased to be the capacitance of capacitor 405-*a* plus the capacitance of capacitor 430. When switching component 230-*a* is deactivated, or disabled, (e.g., by removing or reducing the voltage applied to gate 245-*a*), the capacitance of digit line 115-*b* may be dynamically reduced to be the capacitance of capacitor 405-*a*. The activation and deactivation of switching component 230-*a* may be controlled by a controller (e.g., a memory controller 140) and may be based on the application of voltages to word line 110-*b* and plate 210-*a*. The activation of switching component 230-*a* may be based on activation of word line 110-*b* and/or application of voltage to plate 210-*a*. The deactivation of switching component 230-*a* may be based on activation of sense component 125-*b*.

Figure 5:
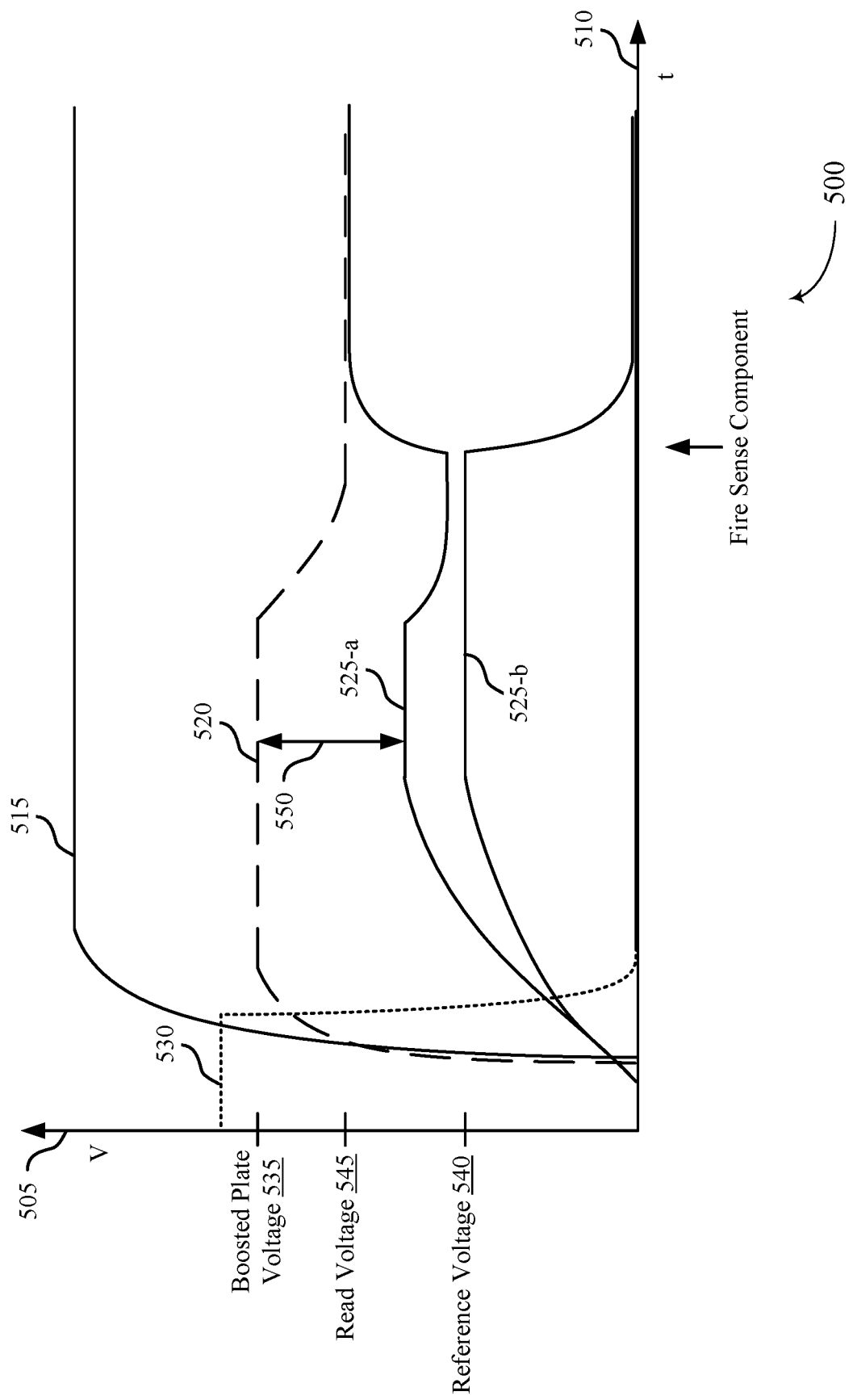
FIG. 5 illustrates an example timing diagram that supports dynamically adjusting digit line capacitance of a ferroelectric memory cell in accordance with various embodiments of the present disclosure.

FIG. 5 illustrates an example of a timing diagram 500 for operating a ferroelectric memory cell array that supports dynamically increasing digit line capacitance of a ferroelectric memory cell in accordance with various embodiments of the present disclosure. Timing diagram 500 includes voltage on axis 505 and time on axis 510 and may represent an operation of circuit 401 or circuit 402. The operation may dynamically adjust (e.g., increase and decrease) the capacitance of digit line 115-*b*.

The voltages of various components of circuit 401 and 402 are also represented as a function of time on timing diagram 500. For example, timing diagram 500 includes word line voltage 515, plate voltage 520, digit line voltage 525-*a*, digit line voltage 525-*b*, and switching component voltage 530. Prior to the operations of timing diagram 500, capacitor 205-*a* may be initialized so that capacitor 205-*a* stores a logic state (e.g., a logic 1 or a logic 0). In the example depicted in timing diagram 500, digit line voltage 525-*a* represents voltage on digit line 115-*b* that corresponds to a logic 1 stored state. Digit line voltage 525-*b* represents voltage on digit line 115-*c*. Digit line 115-*b* and digit line 115-*c* may be initialized to the same voltage prior to the operations of timing diagram 500. In the example depicted in FIG. 5, the voltages of the digit lines may be initialized to 0V (e.g., by activating switching components 415).

Switching component voltage 530 may be applied to switching component 230-*a* so that the switching component 230-*a* is activated. Activation of switching component 230-*a* may connect (e.g., short) digit line 115-*b* to digit line 115-*c* (or capacitor 430) so that the capacitance of digit line 115-*b* is dynamically increased. After activation of switching component 230-*a*, plate voltage 520 may be applied to plate 210-*a* (e.g., plate voltage 520 may be increased to boosted plate voltage 535) and word line voltage 515 may be applied to word line 110-*b*. Word line voltage 515 may be applied to word line 110-*b* so that selection component 220-*a* is activated. When selection component 220-*a* is activated, the voltage on digit line 115-*b* (e.g., digit line voltage 525-*a*) may be the voltage that is applied at plate 210-*a* (e.g., plate voltage 520) minus the voltage across capacitor 205-*a* (which is indicative of a logic 1 or a logic 0). Thus, the digit line voltage 525-*a* may follow the plate voltage 520, minus the voltage across capacitor 205-*a* (e.g., voltage difference 550 for a logic 1). Because digit line 115-*b* and digit line 115-*c* are shorted (e.g., due to the activation of switching component 230-*a*), digit line voltage 525-*b* may be the same as digit line voltage 525-*a*.

After the application of plate voltage 520 and word line voltage 515 (e.g., after memory cell 105-*b* has been selected), the switching component voltage 530 may be reduced so that switching component 230-*a* is deactivated. Deactivation of switching component 230-*a* may isolate digit line 115-*b* from digit line 115-*c*, which may dynamically reduce the capacitance of digit line 115-*b* (e.g., to the intrinsic capacitance of digit line 115-*b*). The reduction of switching component voltage 530 may be based on the amount of time that has expired since the application of word line voltage 515 and/or plate voltage 520. For example, switching component 230-*a* may be deactivated x picoseconds after the plate voltage 520 has been applied. Thus, the isolation of the digit lines 115 may be based on the determination that a threshold amount of time has elapsed since activation of sense component 125-*b*. In another example, the reduction of switching component voltage 530 may be based on the voltage of digit line 115-*b*. For instance, switching component 230-*a* may be deactivated when it has been determined that digit line voltage 525 has reached a threshold value. The voltage of capacitor 405-*a*, and therefore digit line 115-*b*, is a function of the capacitance of digit line 115-*b*. Thus, the deactivation of switching component 230-*a* may be depend on the capacitance of digit line 115-*b* (e.g., the capacitance of capacitor 405-*a* and the capacitance of digit line 115-*c* or capacitor 430).

When digit line 115-*b* is disconnected (e.g., isolated) from digit line 115-*c*, digit line voltage 525-*b* may be different than digit line voltage 525-*a*. Thus, when digit line voltage 525-*a* is reduced (e.g., due to the reduction in plate voltage 520 from boosted plate voltage 535 to read voltage 545), digit line voltage 525-*b* may be unaffected, or nearly unaffected. In some cases, digit line voltage 525-*b* may react to voltage applied by voltage source coupled with digit line 115-*c*. The value of digit line voltage 525-*b* may approach the reference voltage 540 to be used for a sense operation of cell 105-*b*. In some cases, boosted plate voltage 535 may be selected so that digit line voltage 525-*b* is an appropriate reference voltage value (e.g., reference voltage 540) when sense component 125-*a* is activated. Thus, plate voltage 520 may be reduced from boosted plate voltage 535 to a read voltage 545 prior to activation of sense component 125-*a*.

After switching component 230-*a* has been deactivated and the digit line voltage 525 has reached an equilibrium state, sense component 125-*b* may be activated so that the digit line voltage 525 is compared with a reference voltage 540. In some examples, the reference voltage 540 may be the voltage on digit line 115-*c* (e.g., digit line voltage 525-*b*). In the case of a logic 1, the comparison may pull digit line voltage 525-*a* to read voltage 545 and digit line voltage 525-*b* to ground (e.g., 0V). Reference voltage 540 may be midway, or nearly midway, between the voltages on digit line 115-*b* that correspond to a logic 0 and a logic 1. Thus, when the comparison reveals that digit line voltage 525-*a* is above reference voltage 540, the logic state of capacitor 205-*a* may be determined to be a logic 1.

Figure 6:
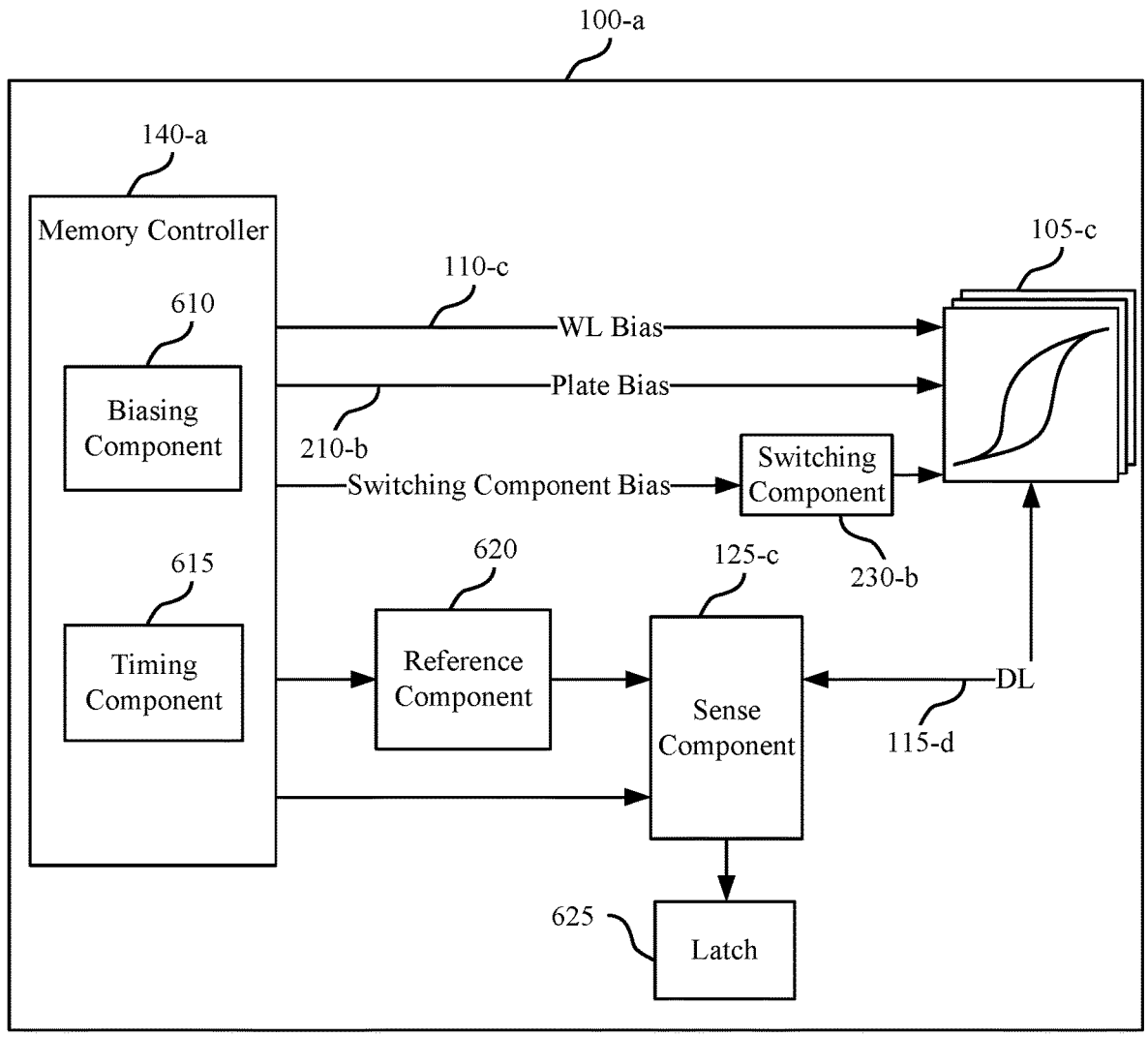
FIG. 6 illustrates a block diagram of an example ferroelectric memory array that supports dynamically adjusting digit line capacitance in accordance with various embodiments of the present disclosure.

FIG. 6 shows a block diagram 600 of a memory array 100-*a* that supports dynamically increasing digit line capacitance of a ferroelectric memory cell in accordance with various embodiments of the present disclosure. Memory array 100-*a* may contain memory controller 140-*a* and memory cells 105-*c*, which may be examples of memory controller 140 and memory cells 105 described with reference to FIGS. 1 and 2. Memory cells 105-*c* may include active memory cells and inactive (e.g., reference) memory cells which corresponding digit lines includes in digit lines 115-*d*. Switching component 230-*b* may short digit lines 115-*d* when activated and isolate digit lines 115-*d* when deactivated.

Memory controller 140-*a* may be in electronic communication with memory cells included in memory cells 105-*c* (e.g., memory controller 140-*a* may be in electronic communication with a first ferroelectric memory cell and a second ferroelectric memory cell). Memory controller 140-*a* may include biasing component 610 and timing module 615 and may operate memory array 100-*a*, and memory cells 105-*c*, as described with reference to FIGS. 1-5. Memory controller 140-*a* may be in electronic communication with word line (or access line) 110-*c*, switching component 230-*b*, digit lines 115-*d*, sense component 125-*c*, and plate 210-*b*, which may be examples of word line 110, digit line 115, sense component 125, and plate 210 described with reference to FIG. 1 or 2. Memory array 100-*a* may also include reference component 620 and latch 625. The components of memory array 100-*a* may be in electronic communication with each other and may perform the functions described with reference to FIGS. 1-5. In some cases, reference component 620, sense component 125-*c* and latch 625 may be components of memory controller 140-*a*.

Memory controller 140-*a* may be operable to activate word line 110-*c*, switching component 230-*b*, plate 210-*b*, or digit lines 115-*d* by applying voltages (e.g., positive and negative voltages) to those various nodes. For example, biasing component 610 may be configured to apply a voltage to operate memory cells 105-*c* to read or write memory cells 105-*c* as described above. The voltages applied to activation components of memory array 100-*a* may be positive voltages or negative voltages. In some cases, memory controller 140-*a* may include a row decoder, column decoder, or both, as described with reference to FIG. 1. This may enable memory controller 140-*a* to access one or more memory cells 105. Biasing component 610 may also apply voltages to reference component 620 in order to generate a reference signal for sense component 125-*c*. Additionally, biasing component 610 may apply voltages for the operation of sense component 125-*c*. Biasing component 610 may communicate or collaborate with timing component 615.

In some cases, memory controller 140-*a* may perform its operations using timing module 615. For example, timing module 615 may control the timing of the various word line selections or plate biasing, including timing for switching and voltage application to perform the memory functions, such as reading and writing, discussed herein. In some cases, timing module 615 may control the operations of biasing component 610.

In some cases, memory controller 140-*a* may facilitate (e.g., via biasing component 610 and timing module 615) dynamic adjustment of capacitance for one or more digit lines included in digit lines 115-*d*. Memory controller 140-*a* may control the biasing of various components in memory array 100-*a*, including components of memory cells 105-*d* and switching component 230-*b*. For example, memory controller 140-*a* may control the application of voltage to memory cells (e.g., via word line 110-*c*) and switching component 230-*b* to perform the operations described with respect to FIGS. 4A, 4B, and 5.

Memory controller 140-*a* may facilitate dynamically increasing the capacitance of a digit line of a ferroelectric memory cell. In one example, dynamically increasing the capacitance includes establishing a connection between the first digit line and a capacitor. In another example, dynamically increasing the capacitance includes shorting the first digit line with a second digit line of a second ferroelectric memory cell. The second ferroelectric memory cell may be inactive memory cell of the ferroelectric memory array 100-*a*. The first digit line with the second digit line may be shorted by activating a switching component (e.g., switching component 230-*b*) that is in electronic communication with the first digit line and the second digit line. Thus, the memory controller 140-*a* may be operable to activate switching component 230-*b*. In some cases, the digit lines of the ferroelectric memory cells may be initialized to a same voltage before increasing the capacitance.

After increasing the digit line capacitance (e.g., by shorting the digit lines) the memory controller 140-*a* may facilitate the activation of a selection component that is in electronic communication with the first digit line. The activation of the selection component may be based at least in part on increasing the capacitance (e.g., based on shorting the first digit line with the second digit line), and/or based at least in part on activating the selection component. The selection component may be activated by applying a voltage (e.g., via biasing component 610) to a word line of the ferroelectric memory cell. The timing of the application of the voltage may be determined by timing component 615. In some cases, the memory controller 140-*a* may facilitate the application (e.g., via biasing component 610) of a voltage to a plate of the first ferroelectric memory cell after shorting the first digit line with the second digit line. The timing of the application of the plate voltage may be determined by timing component 615. The application of the voltage to the plate may occur prior to isolating the first digit line from the second digit line (e.g., prior to reducing the capacitance of the first digit line). Charge may transfer from the first ferroelectric memory cell to the first digit line based at least in part on the application of the voltage to the plate of the ferroelectric memory cell Following activation of the selection component, the memory controller 140-*a* may facilitate reduction of the capacitance of the first digit line. The biasing component 610 may determine when to reduce the capacitance of the first digit line. The capacitance may be reduced by isolating the first digit line from the second digit line. For example, the switching component may be deactivated (e.g., by reducing the voltage applied to the gate of the switching component). The memory controller 140-*a* may be operable to deactivate switching component 230-*b* based at least in part on activation of the selection component. The reduction in voltage applied to the gate of the switching component may be facilitated by biasing component 610. In some cases, the capacitance may be reduced based at least in part on applying the voltage to the word line. The memory controller 140-*a* may determine (e.g., via timing component 615) that a threshold amount of time has elapsed since the activation of the selection component and reduce the capacitance of the first digit line (e.g. isolate the digit lines) based at least in part on the determination that the threshold amount of time has elapsed. Alternatively, the memory controller 140-*a* may determine that a voltage of the first digit line has reached a threshold value and isolate the digit lines based at least in part on the determination that the voltage of the first digit line has reached the threshold value.

The memory controller 140-*a* may also facilitate the activation of a sense component (e.g., sense component 125-*b*) that is in electronic communication with the first digit line. The activation of the sense component may occur within a threshold time after isolating the first digit line from the second digit line, as determined by the timing component 615. The memory controller 140-*a* may be operable to activate the sense component after deactivation of the switching component (e.g., switching component 230-*b*). In some cases, the activation of the sense component may occur while the voltage is applied to the plate of the ferroelectric capacitor. In some cases, the memory controller 140-*a* may be operable to determine that a voltage of the first digit line resulting from the transfer of charge from the first ferroelectric memory cell satisfies a threshold value. The memory controller 140-*a* may facilitate the reduction of the capacitance of the first digit line based at least in part on the determination that the threshold value is satisfied.

Reference component 620 may include various components to generate a reference signal for sense component 125-*c*. Reference component 620 may include circuitry specifically configured to produce a reference signal. In some cases, reference component 620 may be other ferroelectric memory cells 105. In some examples, reference component 620 may be configured to output a voltage with a value between the two sense voltages, as described with reference to FIG. 3. Or reference component 620 may be designed to output a virtual ground voltage (i.e., approximately 0V).

Sense component 125-*c* may compare a signal from memory cell 105-*c* (through digit lines 115-*d*) with a reference signal from reference component 620. Upon determining the logic state, the sense component may then store the output in latch 625, where it may be used in accordance with the operations of an electronic device using the memory device of which memory array 100-*a* is a part.

Figure 7:
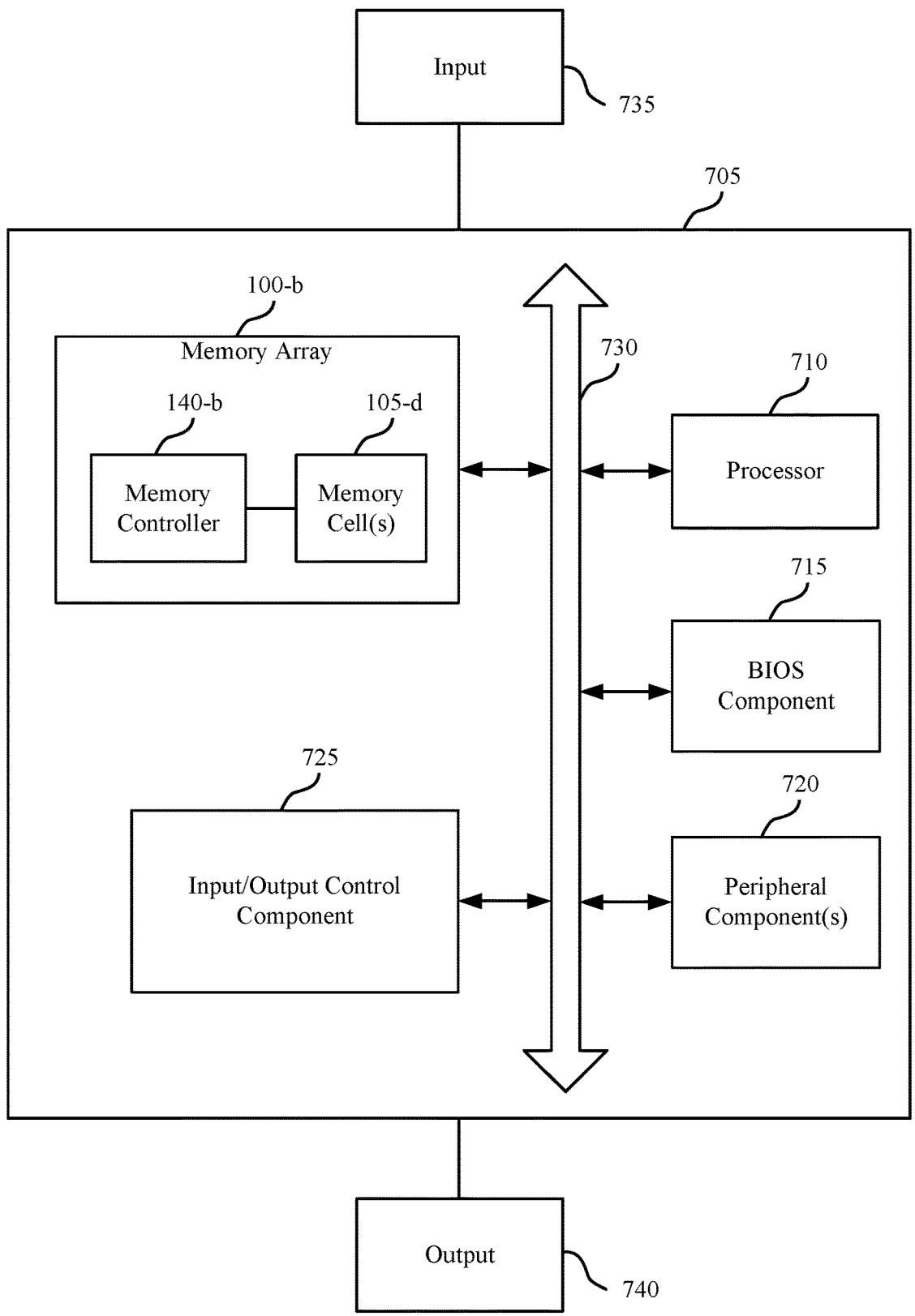
FIG. 7 illustrates a block diagram of a device, including a memory array, that supports dynamically adjusting digit line capacitance in accordance with various embodiments of the present disclosure.

FIG. 7 illustrates a system 700 that supports dynamically increasing digit line capacitance of a ferroelectric memory cell in accordance with various embodiments of the present disclosure. System 700 includes a device 705, which may be or include a printed circuit board to connect or physically support various components. Device 705 includes a memory array 100-*b*, which may be an example of memory array 100 described with reference to FIGS. 1 and 6. Memory array 100-*b* may contain memory controller 140-*b* and memory cells 105-*d*, which may be examples of memory controller 140 described with reference to FIGS. 1 and 6 and memory cells 105 described with reference to FIG. 1, 2, 4A, 4B, and 6. Device 705 may also include a processor 710, BIOS component 715, peripheral component(s) 720, and input/output control component 725. The components of device 705 may be in electronic communication with one another through bus 730.

Processor 710 may be configured to operate memory array 100-*a* through memory controller 140-*b*. In some cases, processor 710 may perform the functions of memory controller 140 described with reference to FIGS. 1 and 6. In other cases, memory controller 140-*b* may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including dynamically increasing the capacitance of a ferroelectric memory cell's digit line capacitance. Processor 710 may, for example, be configured to execute computer-readable instructions stored in memory array 100-*b* to cause device 705 perform various functions or tasks (e.g., those described with reference to FIGS. 1-6.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 725 may manage data communication between processor 710 and peripheral component(s) 720, input devices 735, or output devices 740.

Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output device 740 may represent a device or signal external to device 705 configured to receive output from device 705 or any of its components. Examples of output device 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-*b,* device 705, and memory array 100-*b* may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
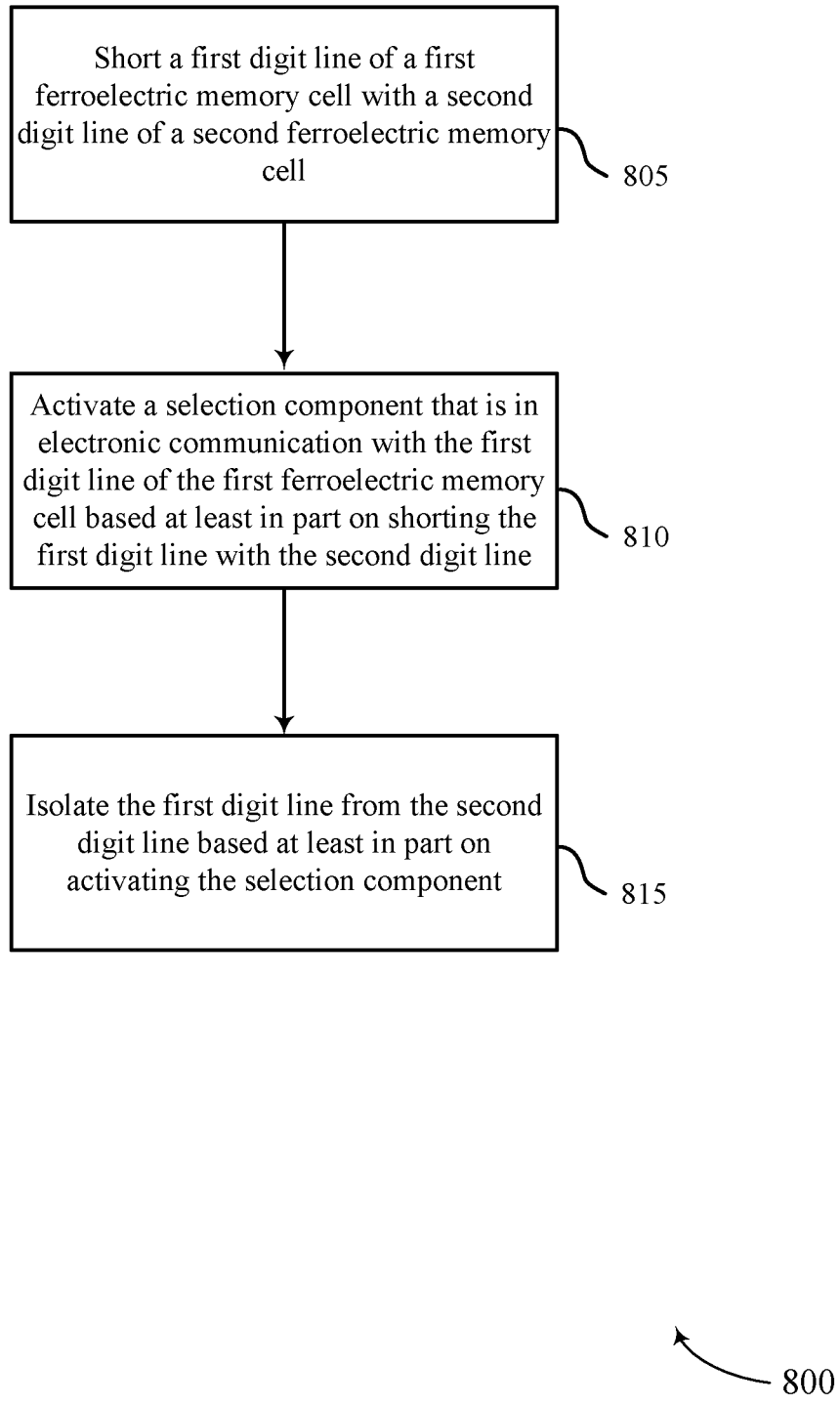
FIGS. 8 and 9 are flowcharts that illustrate a methods for operating a memory cell that supports dynamically adjusting digit line capacitance in accordance with various embodiments of the present disclosure.

FIG. 8 shows a flowchart illustrating a method 800 for dynamically increasing digit line capacitance of a ferroelectric memory cell in accordance with various embodiments of the present disclosure. The operations of method 800 may be implemented by a memory array 100, as described with reference to FIGS. 1-7. For example, the operations of method 800 may be performed by a memory controller 140, as described with reference to FIGS. 1, 6, and 7. In some examples, a memory controller 140 may execute a set of codes to control the functional elements of the memory array 100 to perform the functions described below. Additionally or alternatively, the memory controller 140 may perform aspects the functions described below using special-purpose hardware.

At block 805, the method may include shorting a first digit line of a first ferroelectric memory cell with a second digit line of a second ferroelectric memory cell (e.g., an inactive memory cell). In some cases, shorting the first digit line with the second digit line includes activating a switching device that is in electronic communication with the first digit line and the second digit line. The first digit line and the second digit line may be initialized to a same voltage before shorting the first digit line with the second digit line (i.e., the shorting may occur after the initialization). In certain examples, the operations of block 805 may be performed or facilitated by the components (e.g., the biasing component 610 and/or the timing component 615) of a memory controller 140, as described with reference to FIG. 6.

At block 810, the method may include activating a selection component that is in electronic communication with the first digit line of the first ferroelectric memory cell based at least in part on shorting the first digit line with the second digit line. In some cases, the method includes applying a voltage to a plate of the first ferroelectric memory cell after shorting the first digit line with the second digit line. This application may occur prior to isolating the first digit line from the second digit line. The application of a voltage to the plate of the first ferroelectric memory cell may result in charge transferring from the ferroelectric memory cell to the first digit line. This transfer in charge may result in a voltage on the first digit line. In certain examples, the operations of block 810 may be performed or facilitated by the components (e.g., the biasing component 610 and/or the timing component 615) of a memory controller 140, as described with reference to FIG. 6.

At block 815, the method may include isolating the first digit line from the second digit line based at least in part on activating the selection component. In some cases, the method may include determining that a threshold amount of time has elapsed since the activation of the selection component. The isolation may be based at least in part on the determination that the threshold amount of time has elapsed. In another example, the method may include determining that a voltage of the first digit line has reached a threshold value, wherein the isolation is based at least in part on the determination that the voltage of the first digit line has reached the threshold value. In some cases, the method includes activating a sense component that is in electronic communication with the first digit line within a threshold time after isolating the first digit line from the second digit line. The sense component may compare the voltage on the first digit line with a reference voltage (e.g., the voltage on the second digit line) to determine a logic state of the cell. In certain examples, the operations of block 815 may be performed or facilitated by the components (e.g., the biasing component 610 and/or the timing component 615) of a memory controller 140, as described with reference to FIG. 6.

Figure 9:
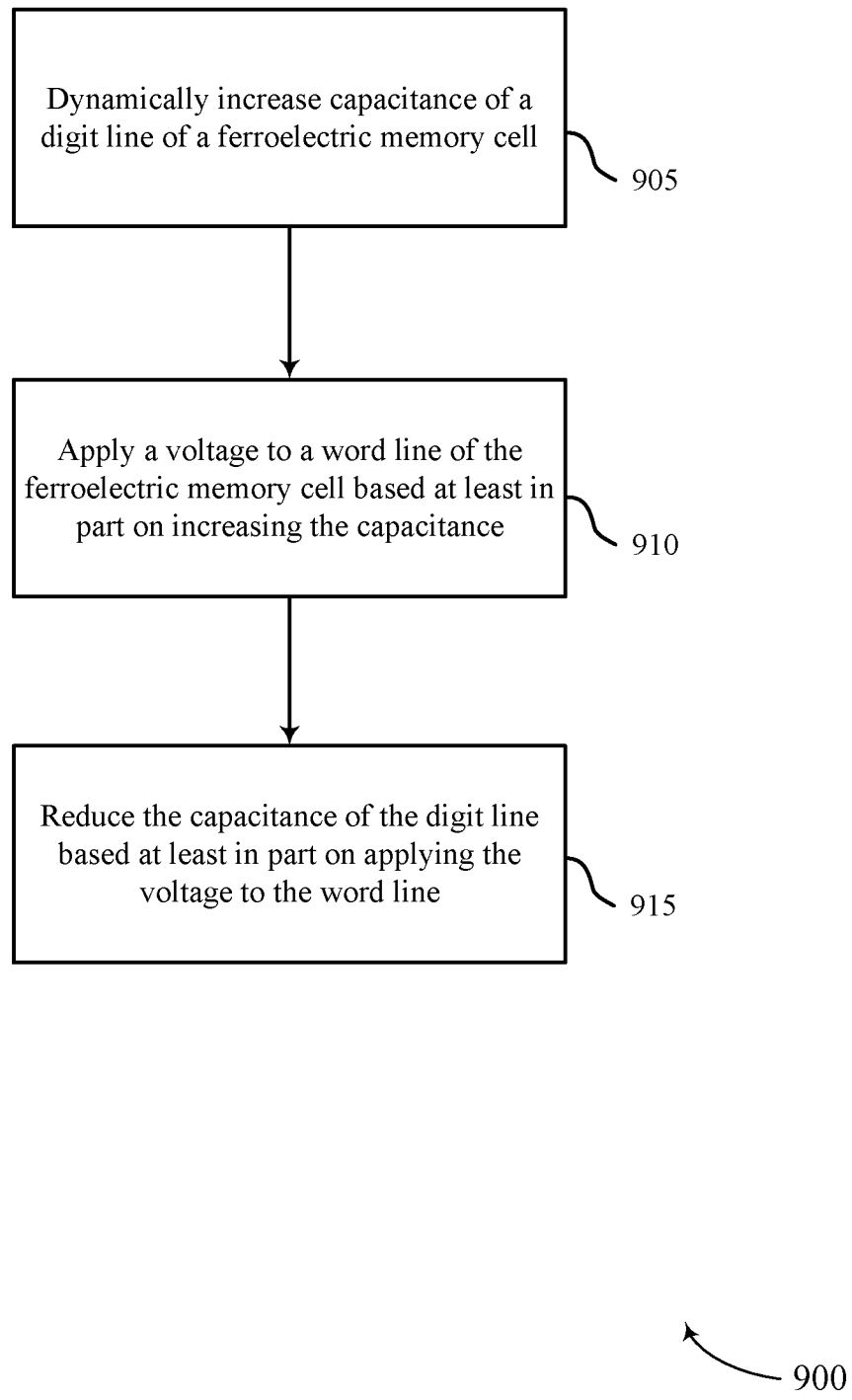

FIG. 9 shows a flowchart illustrating a method 900 for dynamically increasing digit line capacitance of a ferroelectric memory cell in accordance with various embodiments of the present disclosure. The operations of method 900 may be implemented by a memory array 100, as described with reference to FIGS. 1-6. For example, the operations of method 900 may be performed by a memory controller 140, as described with reference to FIGS. 1, 6, and 7. In some examples, a memory controller 140 may execute a set of codes to control the functional elements of the memory array 100 to perform the functions described below. Additionally or alternatively, the memory controller 140 may perform aspects the functions described below using special-purpose hardware.

At block 905, the method may include dynamically increasing a capacitance of a digit line of a ferroelectric memory cell. In some cases, dynamically increasing the capacitance includes shorting the digit line of the ferroelectric memory cell with a digit line of another ferroelectric memory cell. The digit lines of the ferroelectric memory cells may be initialized to a same voltage before increasing the capacitance (e.g., before shorting the digit lines). In some cases, dynamically increasing the capacitance includes establishing a connection between the digit line of the ferroelectric memory cell and a capacitor. In certain examples, the operations of block 905 may be performed or facilitated by the memory controller 140, as described with reference to FIG. 6.

At block 910, the method may include applying a voltage to a word line of the ferroelectric memory cell based at least in part on increasing the capacitance. In some cases, the method may include applying a voltage to a ferroelectric capacitor of the ferroelectric memory cell after increasing the capacitance of the digit line. The application of the voltage may occur prior to reducing the capacitance of the digit line. The method may also include transferring charge from the ferroelectric memory cell to the digit line based at least in part on the application of the voltage to the ferroelectric memory cell. In certain examples, the operations of block 910 may be performed or facilitated by the memory controller 140, as described with reference to FIG. 6.

At block 915, the method may include reducing the capacitance of the digit line based at least in part on applying the voltage to the word line. In some examples, the method may include determining that a threshold amount of time has expired since applying the voltage to the word line. Reducing the capacitance may be based at least in part on the determination that the threshold amount of time has expired. In another example, the method may include determining that a voltage of the digit line resulting from the transfer of charge satisfies a threshold value. Reducing the capacitance of the digit line is based at least in part on the determination that the threshold value is satisfied. After reducing the capacitance of the digit line, a sense component in electronic communication with the digit line may be activated. The sense component may be activated while the voltage is applied to the ferroelectric capacitor. In certain examples, the operations of block 915 may be performed or facilitated by the memory controller 140, as described with reference to FIG. 6.

Thus, methods 800 and 900 may provide methods of operating a ferroelectric memory array with or to provide for dynamic adjustment of digit line capacitance. It should be noted that methods 800 and 900 describe possible implementations, and the operations and steps may be rearranged or otherwise modified such that other implementations are possible. In some examples, aspects from two or more of the methods 800 and 900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "embodiment," "example," and "exemplary," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently flowing between the components. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk, and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
   coupling a first digit line of a first memory cell with a second digit line of a second memory cell;
   applying a voltage to a plate line of the first memory cell during a period of time that the first digit line and the second digit line are coupled; and
   isolating the first digit line from the second digit line based at least in part on applying the voltage to the plate line of the first memory cell.

2. The method of claim 1, further comprising:
   activating a first switching component coupled with the first memory cell and the first digit line after coupling the first digit line with the second digit line; and
   activating a sense component coupled with the first memory cell after isolating the first digit line from the second digit line.

3. The method of claim 1, further comprising:
   initializing the first digit line and the second digit line to a same voltage before coupling the first digit line with the second digit line.

4. The method of claim 3, wherein initializing the first digit line and the second digit line comprises:
   activating a first switching component coupled with the first digit line and a first ground reference; and
   activating a second switching component coupled with the second digit line and a second ground reference.

5. The method of claim 1, further comprising:
   identifying a logic state of the first memory cell based at least in part on isolating the first digit line from the second digit line, wherein the logic state of the first memory cell is based at least in part on a second voltage associated with a reference memory cell.

6. The method of claim 1, further comprising:
   identifying a second voltage of the first digit line based at least in part on applying the voltage to the first digit line, wherein isolating the first digit line from the second digit line is based at least in part on the second voltage.

7. The method of claim 1, wherein coupling the first digit line with the second digit line comprises:
shorting the first digit line and the second digit line.

8. A method, comprising:
coupling a first access line of a first memory cell with a second access line of a second memory cell;
selecting the first memory cell based at least in part on coupling the first access line with the second access line;
applying a voltage to the first access line of the first memory cell after coupling the first access line with the second access line, wherein applying the voltage to the first access line is based at least in part on selecting the first memory cell, and wherein the second memory cell comprises a reference memory cell; and
isolating the first access line from the second access line based at least in part on applying the voltage to the first access line of the first memory cell.

9. An apparatus, comprising:
a first memory cell coupled with a first digit line;
a second memory cell coupled with a second digit line; and
a memory controller coupled with the first memory cell, wherein the memory controller is operable to cause the apparatus to:
couple the first digit line of the first memory cell with the second digit line of the second memory cell;
apply a voltage to a plate line of the first memory cell during a period of time that the first digit line and the second digit line are coupled; and
isolate the first digit line from the second digit line based at least in part on applying the voltage to the plate line of the first memory cell.

10. The apparatus of claim 9, wherein the memory controller is operable to cause the apparatus to:
activate a first switching component coupled with the first memory cell and the first digit line after coupling the first digit line with the second digit line; and
activating a sense component coupled with the first memory cell after isolating the first digit line from the second digit line.

11. The apparatus of claim 9, wherein the memory controller is operable to cause the apparatus to:
initialize the first digit line and the second digit line to a same voltage before coupling the first digit line with the second digit line.

12. The apparatus of claim 11, wherein the memory controller is operable to cause the apparatus to initialize the first digit line and the second digit line by being operable to cause the apparatus to:
activate a switching component coupled with the first digit line and a first ground reference; and
activate a second switching component coupled with the second digit line and a second ground reference.

13. The apparatus of claim 9, wherein the second memory cell is coupled with the second digit line by a switching component that is configured to be deactivated.

14. An apparatus comprising:
a first memory cell coupled with a first access line;
a second memory cell coupled with a second access line; and
a memory controller coupled with the first memory cell, wherein the memory controller is operable to cause the apparatus to;
couple the first access line of the first memory cell with the second access line of the second memory cell;
apply a voltage to the first access line of the first memory cell after coupling the first access line with the second access line;
identify a second voltage of the first access line based at least in part on applying the voltage to the first access line;
deactivate a switching component coupled with the first access line and the second access line based at least in part on the second voltage; and
isolate the first access line from the second access line based at least in part on applying the voltage to the first access line of the first memory cell and deactivating the switching component.

15. The apparatus of claim 14, wherein the memory controller is operable to:
determine a logic state of the first memory cell based at least in part on deactivating the switching component coupled with the first access line and the second access line.

16. An apparatus, comprising:
a first memory cell coupled with a first access line;
a second memory cell coupled with a second access line that is coupled with the first access line;
a switching component coupled with the first access line and the second access line; and
a memory controller operable to cause the apparatus to:
activate the switching component to couple the first access line with the second access line;
apply a voltage to a third access line of the first memory cell during a period of time the switching component couples the first access line with the second access line; and
deactivate the switching component to isolate the first access line from the second access line based at least in part on applying the voltage to the third access line of the first memory cell.

17. The apparatus of claim 16, further comprising:
a sense component coupled with the first access line, wherein the sense component is configured to determine a logic state of the first memory cell based at least in part on a reference value stored in the second memory cell.

18. An apparatus, comprising:
a first memory cell coupled with a first access line;
a second memory cell coupled with a second access line that is coupled with the first access line;
a switching component coupled with the first access line and the second access line, wherein the switching component is configured to short the first access line with the second access line upon being activated; and
a selection component coupled with the first access line and the second access line and configured isolate the first memory cell from the second memory cell based at least in part on a voltage of the first access line.

19. The apparatus of claim 18, wherein activating the switching component adjusts a capacitance of the first access line.

20. The apparatus of claim 19, wherein activating the switching component increases the capacitance of the first access line.

* * * * *